(12) United States Patent
Kenington

(10) Patent No.: US 6,847,259 B2
(45) Date of Patent: Jan. 25, 2005

(54) AMPLIFIER

(75) Inventor: Peter Kenington, Chepstow (GB)

(73) Assignee: Andrew Corporation, Orland Park, IL (US)

(*) Notice: Subject to any disclaimer, the term of this patent is extended or adjusted under 35 U.S.C. 154(b) by 118 days.

(21) Appl. No.: 10/204,995

(22) PCT Filed: Feb. 13, 2001

(86) PCT No.: PCT/GB01/00583

§ 371 (c)(1),
(2), (4) Date: Oct. 21, 2002

(87) PCT Pub. No.: WO01/63744

PCT Pub. Date: Aug. 30, 2001

(65) Prior Publication Data

US 2003/0112068 A1 Jun. 19, 2003

(30) Foreign Application Priority Data

Feb. 24, 2000 (GB) .............................................. 0004419

(51) Int. Cl.⁷ .............................. H03F 1/26; H03G 3/20
(52) U.S. Cl. ......................... 330/149; 330/107; 330/136
(58) Field of Search ................................ 330/107, 129, 330/136, 149, 285

(56) References Cited

U.S. PATENT DOCUMENTS

| | | | |
|---|---|---|---|
| 3,895,316 A | 7/1975 | Fein | 332/120 |
| 4,462,004 A | 7/1984 | Cox et al. | 330/277 |
| 4,761,798 A | 8/1988 | Griswold, Jr. et al. | 375/295 |
| 5,329,260 A | 7/1994 | Poplin | 332/119 |
| 5,886,572 A * | 3/1999 | Myer et al. | 330/10 |
| 6,078,628 A * | 6/2000 | Griffith et al. | 375/300 |
| 6,084,468 A * | 7/2000 | Sigmon et al. | 330/136 |
| 6,445,249 B1 * | 9/2002 | Khan et al. | 330/149 |

FOREIGN PATENT DOCUMENTS

| | | |
|---|---|---|
| EP | 0 377 519 A | 7/1990 |
| EP | 0 478 265 A | 4/1992 |

* cited by examiner

*Primary Examiner*—Steven J. Mottola
(74) *Attorney, Agent, or Firm*—Steve Mendelsohn

(57) ABSTRACT

A signal to be amplified is provided in polar format comprising an amplitude component (210) and a phase component (212). The amplitude component (210) is used to bias the phase component (212). The gain of amplifier (220) depends upon the bias of the signal that it receives. Therefore, the bias given to the phase component (212) provides the envelope characteristics of the output signal (224) of amplifier (220). Both (or either) of the amplitude component (210) and the phase component (212) may be predistorted (226, 310) to eliminate distortion appearing in the output signal (224).

16 Claims, 9 Drawing Sheets

AMPLIFIER

The invention related to amplifiers and methods of amplifying signals, and in particular to amplification of RF signals.

Adaptive biasing is used in linear power amplifiers as an efficiency boosting mechanism. The essence of the technique is to maintain a bias level just sufficient to reproduce the required modulation and to dynamically increase and decrease this bias level as required to follow the envelope of the input signal.

The adaptive bias technique was primarily proposed to overcome the poor power-added efficiencies in linear class-A amplification, caused by the use of back-off as a linearisation technique. The efficiency of a class-A stage will typically be lowered in proportion to the square of the back-off used and hence can very quickly fall to only a few percent (for, say, 10dB back-off).

Figure 1:
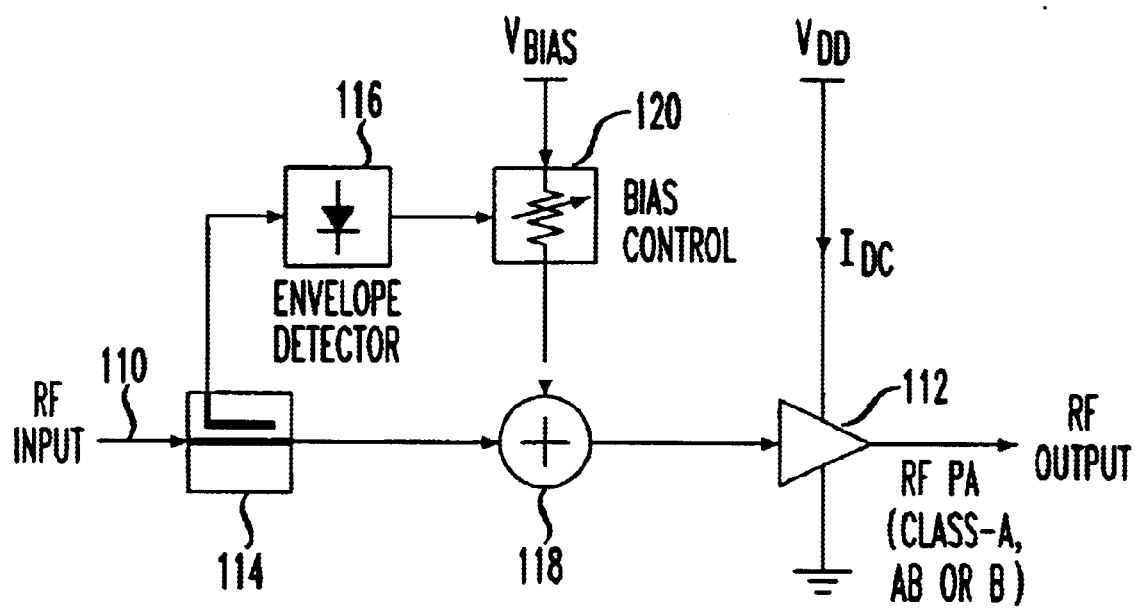

A conventional adaptive bias scheme 100 is shown in FIG. 1. The input signal 110 destined for amplification by amplifier 112 is sampled at directional coupler 114. This sample is supplied to envelope detector 116, and the detected envelope signal produced by detector 116 is used to control a bias signal added to the input signal 110 at combiner 118. The bias signal is controlled using a bias control element 120 which receives the envelope signal as a control input. For example, the bias control element 120 can be a FET, and the envelope signal can be used to vary the bias on its gate terminal in order to vary the standing bias current drawn from the supply. This ensures that the amplifier 112 always has sufficient bias current to operate in its linear region, and hence maintain relatively low levels of distortion, without drawing an excessive supply current at low envelope levels (where this is unnecessary).

The additional circuitry required in scheme 100 is relatively simple and, due to the high resistance of a FET gate, generally requires little power from the supply. Thus, little of the efficiency gained by using scheme 100 is lost in its control circuitry.

The only major restriction placed on scheme 100 is that its gain should remain the same at (ideally) all levels of gate bias voltage. If this is not the case, significant AM—AM distortion will result and hence operation of scheme 100 will significantly degrade the linearity of the amplifier, compared with conventional class-A operation.

The present invention seeks to provide linear amplification using an unrelated biasing technique.

According to a first aspect, the invention provides apparatus for amplifying an input signal to produce an output signal, comprising means for providing the input signal in polar format comprising an amplitude component and a phase component, biasing means for deriving a bias signal from the amplitude component, means for combining the bias signal with the phase component to produce a biased phase component signal, and an amplifying means whose gain depends upon the bias provided to the signal it amplifies, wherein the amplifying means is supplied with the biased phase component signal to produce the output signal.

According to a second aspect, the invention provides a method of amplifying an input signal to produce an output signal, comprising providing the input signal in polar format comprising an amplitude component and a phase component, deriving a bias signal from the amplitude component, combining the bias signal with the phase component to produce a biased phase component signal and amplifying the biased phase component signal to produce the output signal using an amplifier whose gain depends upon the bias provided to the signal which it amplifies.

Hence the amplitude modulation conveyed by the amplitude component of the input signal is used to vary the gain of the amplification process to provide envelope information to the output signal.

Preferably, the amplifier is designed such that a variation of its bias level is capable of altering its characteristics from pure class-A through to very low conduction angle class-C.

In the preferred embodiment, a linearisation scheme is employed to counteract distortion produced by the amplifier. The linearisation scheme may be a predistortion scheme for predistorting the input signal. If a predistortion scheme is used, then either or both of the polar components of the input signal may be predistorted. The predistortion scheme may operate on the polar components of the input signal in the digital domain. The predistortion scheme may monitor residual distortion in the output signal and make appropriate changes to the predistortion to further reduce the residual distortion.

In another embodiment, feedback from the output signal may be used directly to adapt the input signal to provide a form of linearisation. This type of linearisation is particularly suited to narrow-band signals and real-time adaption of the linearisation scheme to adapt to variations in the distortion caused by the amplifier.

The input signal may be provided directly in terms of amplitude and phase components. The amplitude and phase components respectively may be channels of amplitude and phase modulation information provided by, for example, a digital signal processor (DSP). The phase modulation information can be used by signal generating means, such as a voltage controlled oscillator (VCO), to produce a phase modulated signal, i.e. the phase component of the input signal. The amplitude modulation information may then be used to derive the bias signal for combination with the phase component.

Alternatively, the input signal may be provided in quadrature (I&Q) format. The quadrature format input signal may be converted to polar format for use in the present system.

Normally, the amplitude modulation information is available directly and this is used to generate the bias signal. However, where the modulation information is modulated onto a carrier signal, the amplitude modulation can be extracted and used to produce the bias signal.

Generally, the bias signal may be provided by amplifying a signal indicative of the envelope of the amplitude component (predistorted, if appropriate).

Where the input signal is provided in the form of a modulated carrier signal, the phase component may be provided by limiting the modulated carrier to remove envelope variations therefrom. Where it is desired to modulate the phase information in a system in which the phase component is created in this way, the limited signal may be subjected to phase detection to recover the phase modulation information which may then be predistorted prior to being modulated on to a carrier signal (using, for example, a voltage controlled oscillator) to produce the phase component.

Figure 4:
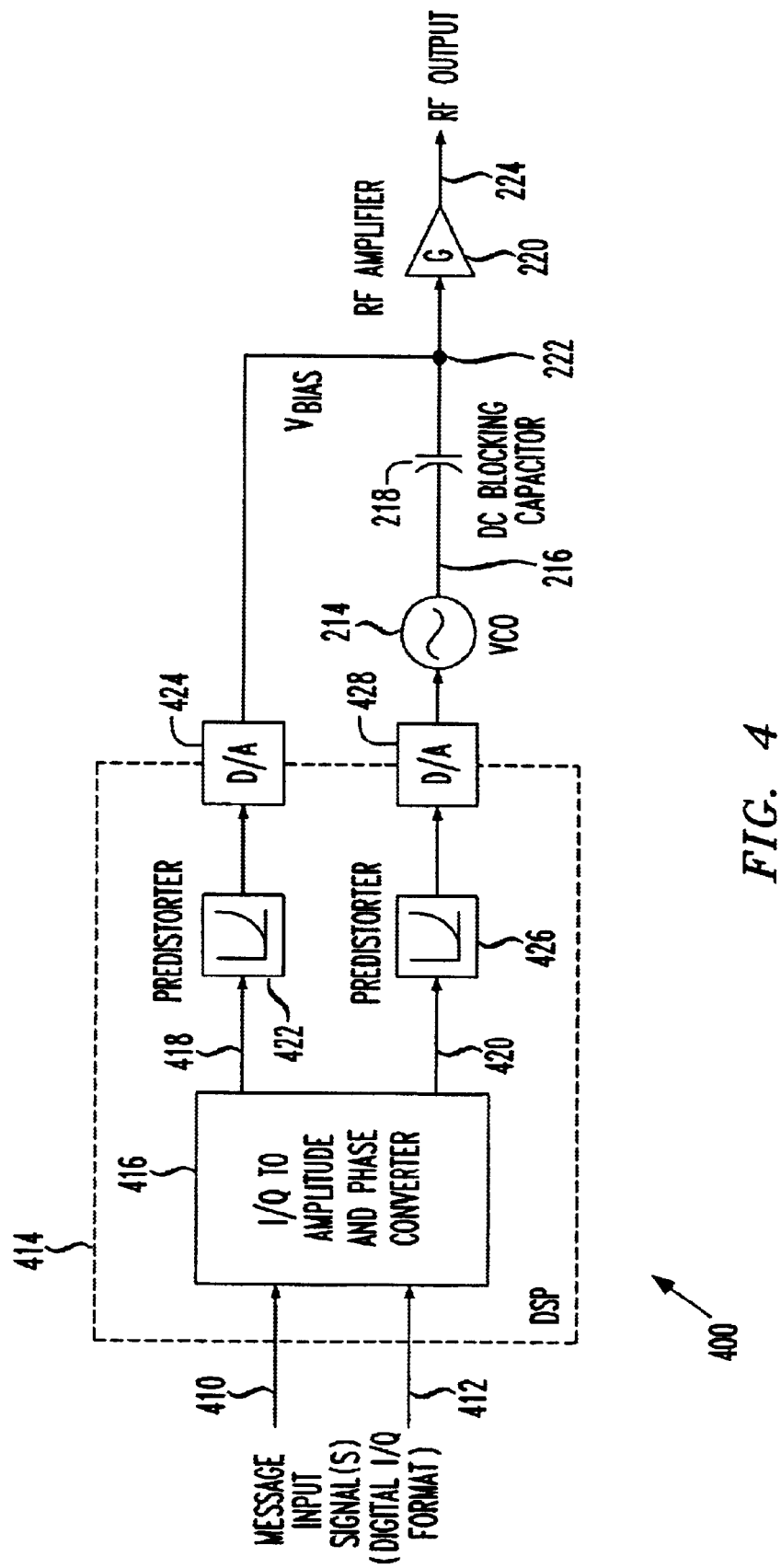
Figure 5:
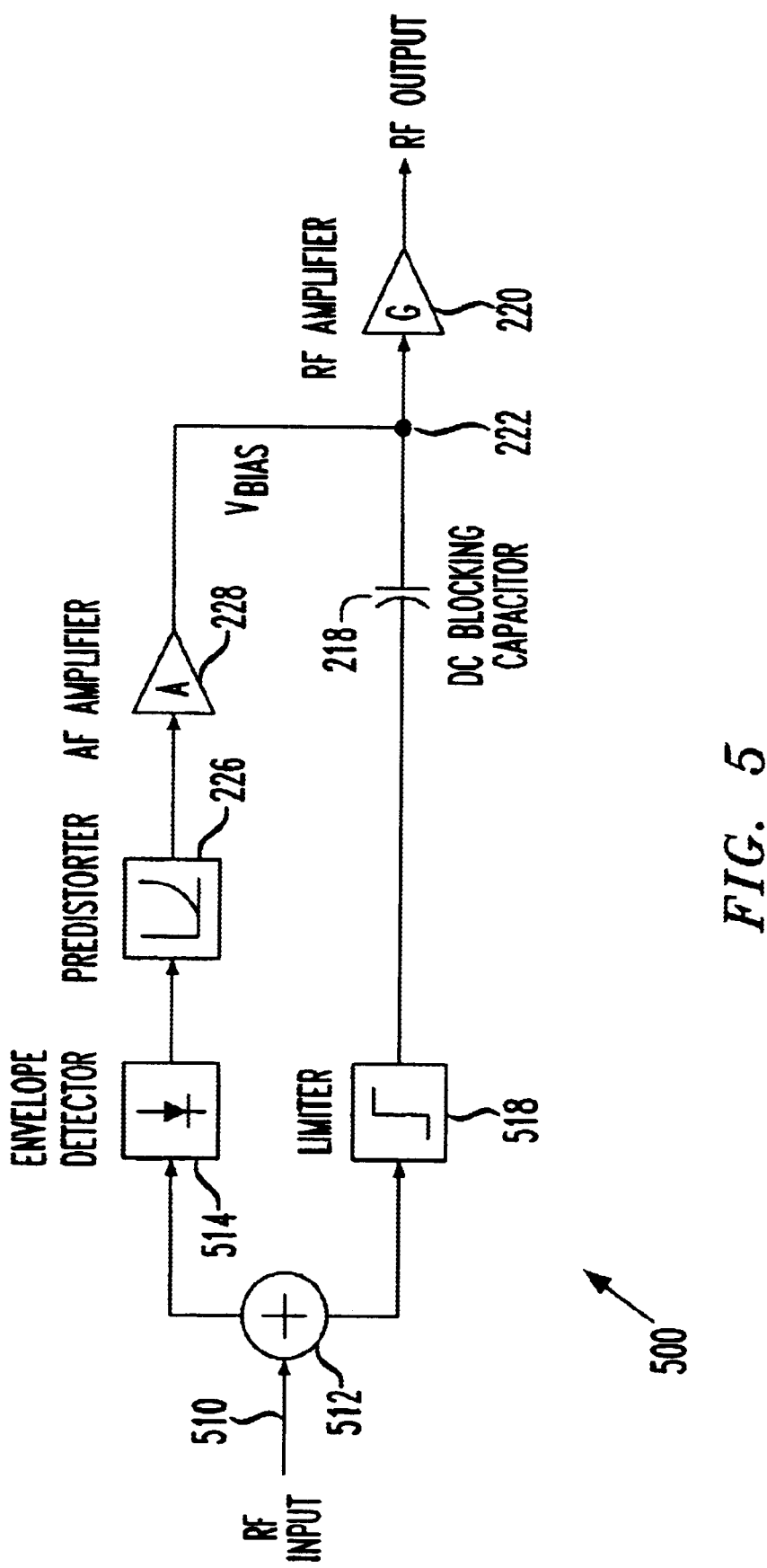
Figure 7:
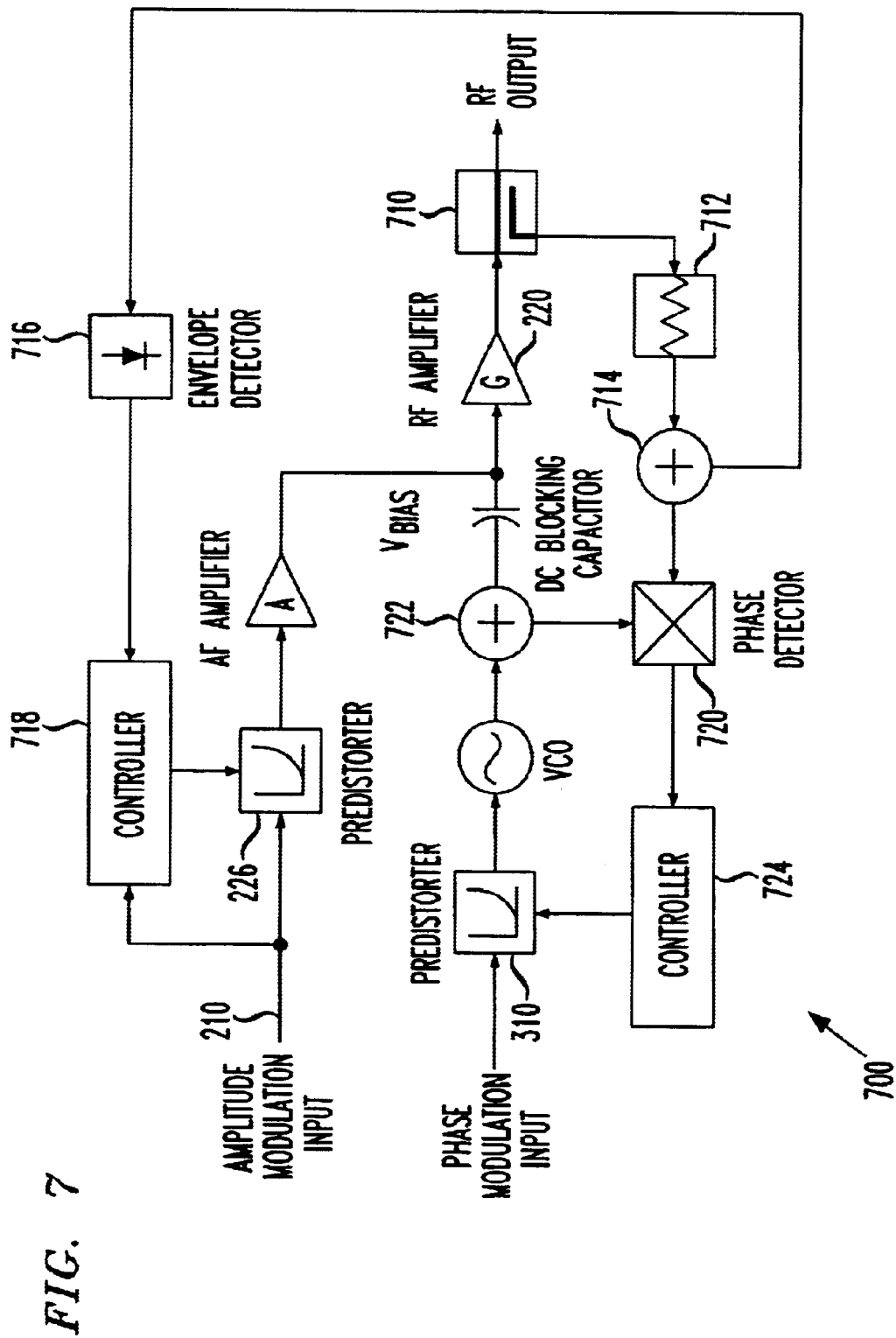
Figure 8:
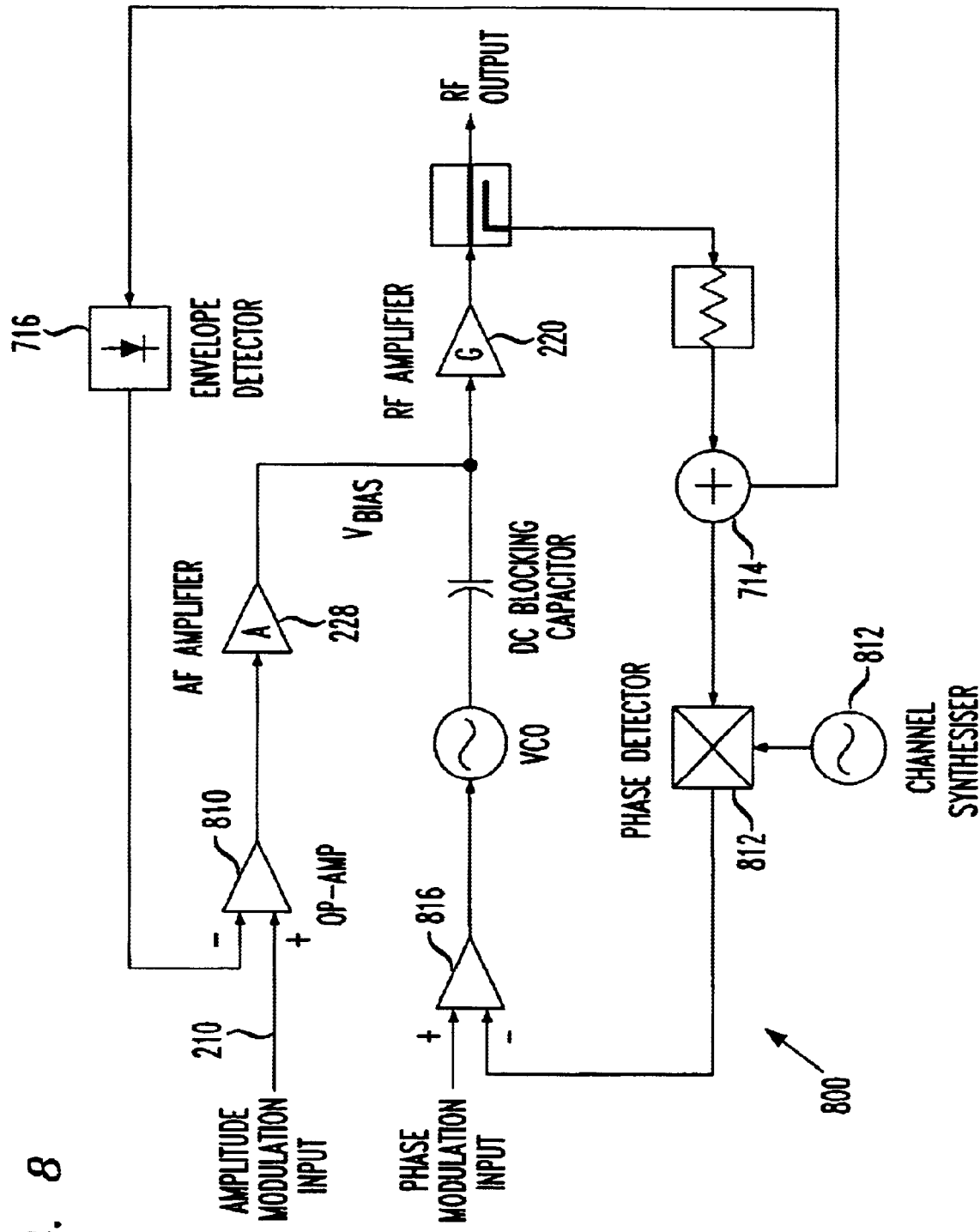
Figure 9:
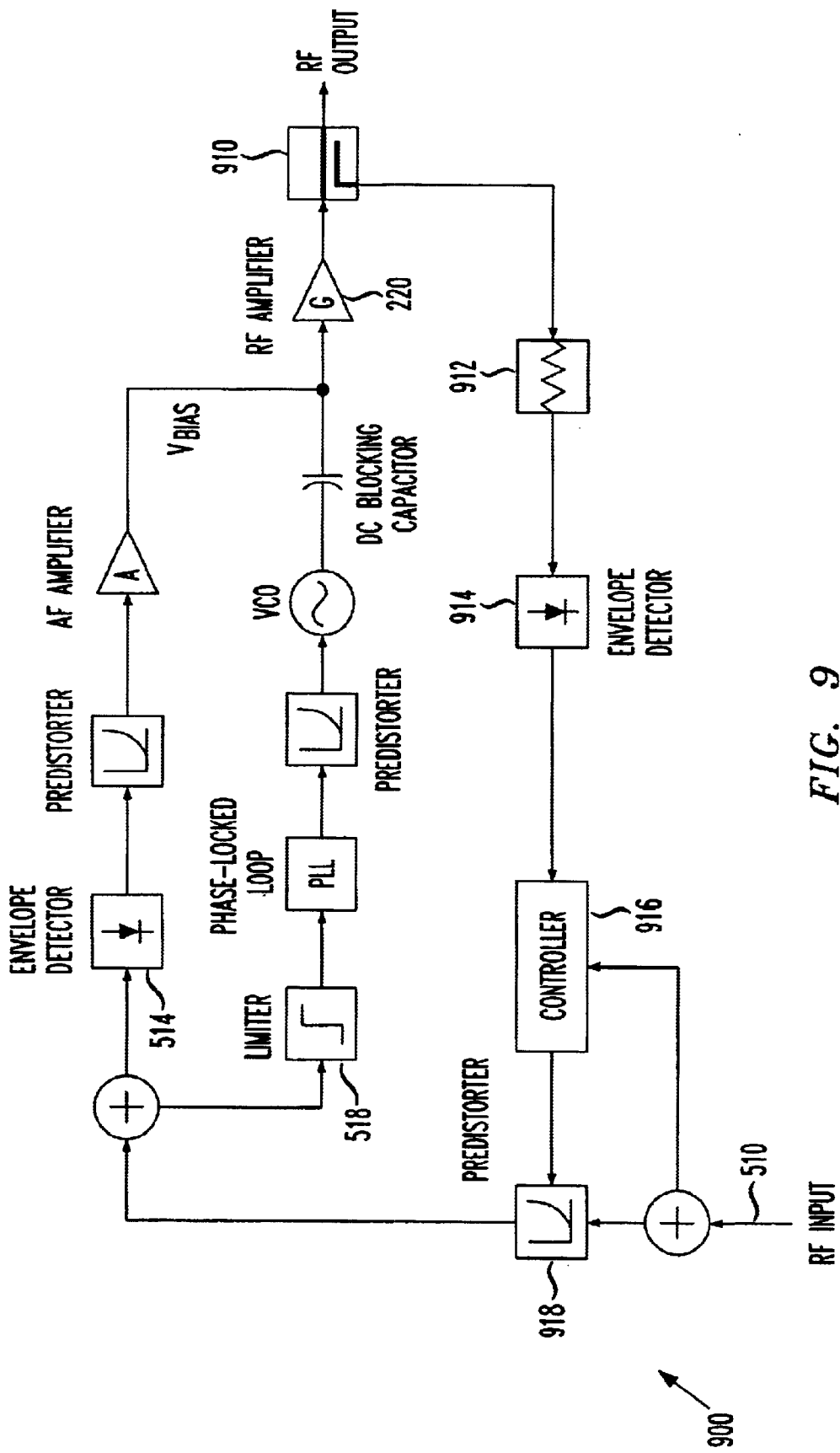

By way of example only, certain embodiments of the invention will now be described with reference to the accompanying figures, in which:

FIG. 1 illustrates a known biased amplifier arrangement;

FIGS. 2 to 6 each illustrate schematically a biased amplifier operating on amplitude and phase modulation information;

FIGS. 4 and 5 each illustrate schematically a biased amplifier operating on a modulated RF carrier signal; and FIGS. 7 to 9 each illustrate schematically the application of adaptive linearisation to a biased amplifier.

In the following description, elements, common to more than one of the described amplifying schemes retain the same reference numerals, and the description of their function will not be repeated.

Figure 2:
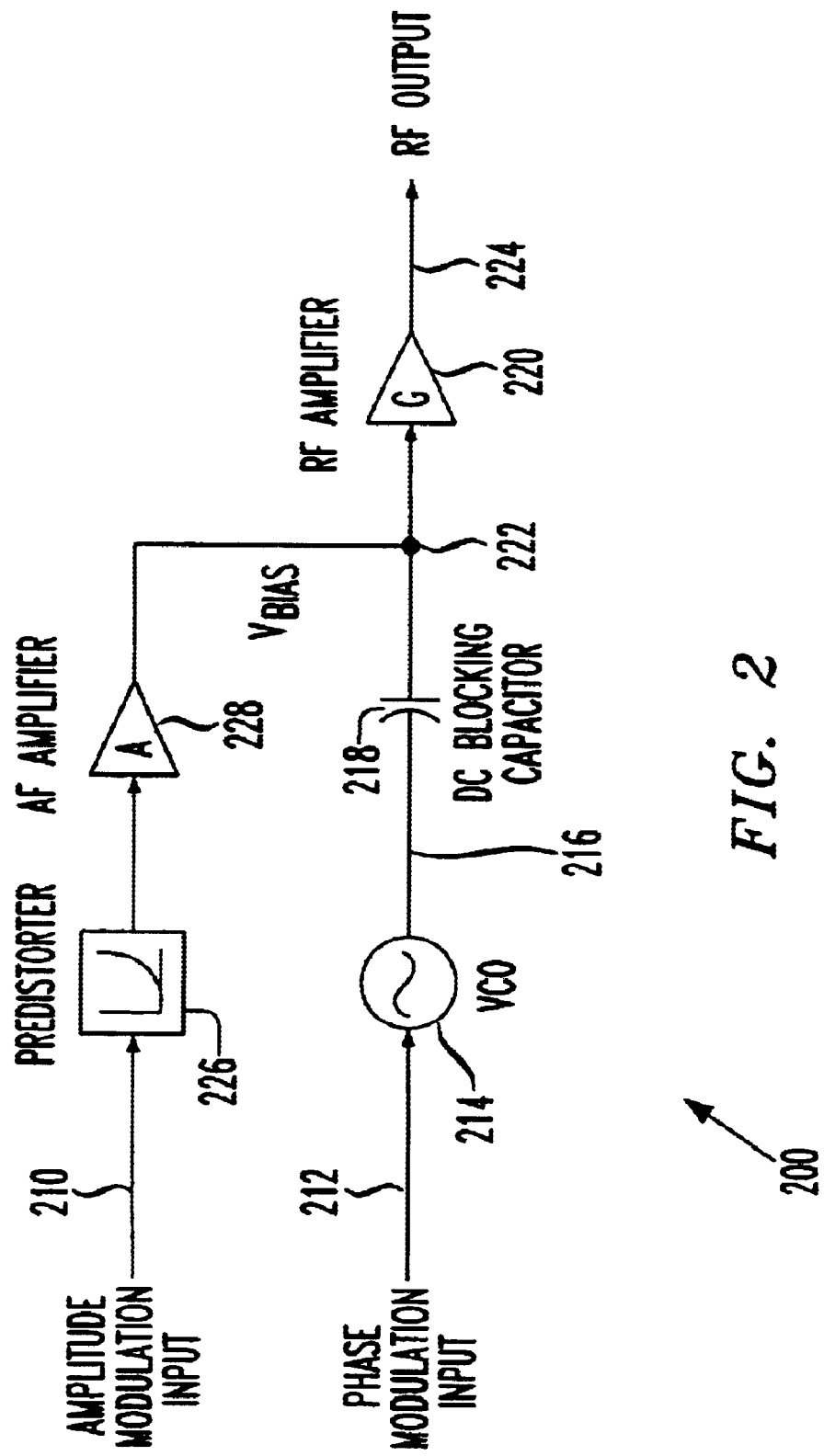

In the amplification scheme 200 of FIG. 2, the input signal is provided at baseband and in the form of amplitude modulation information 210 and phase modulation information 212. These phase and amplitude components 210 and 212 may be provided by, for example, a DSP.

The amplitude modulation information 210 is predistorted by predistorter 226, and then supplied to audio frequency amplifier 228 which outputs a corresponding DC bias voltage signal. The phase component 212 is used in the direct modulation of a voltage control oscillator (VCO) 214 or a frequency synthesiser (not shown, but which may incorporate up or down conversion to the final carrier or system frequency). The phase modulated signal 216 output by VCO 214 is fed, via DC blocking capacitor 218, towards amplifier 220. At 222, the DC bias voltage signal is combined with the phase modulated signal 216 (subsequent to capacitor 218).

The amplifier 220 is designed such that variation of its bias level is capable of altering it from a pure class-A configuration to a very low conduction angle class-C configuration. This requires the bias level to vary from a "positive" value through "zero bias" to a relatively large "negative" value, ultimately leading to complete cut-off of the amplifier. In practice, the precise voltages required to do this are determined by the device technology employed for the amplifier 220 (e.g. BJT, FET, etc.) and may, in some cases, require a positive voltage to be used to obtain zero and/or "negative" bias.

The result of this alteration of the bias level will be a modulation of both the gain of the amplifier 220 and its power output capability, both of which will lead to the output signal 224 of amplifier 220 having a varying amplitude envelope. When the amplifier 220 is operating in class-A configuration, a maximum value of both gain and output power will be available. When it is operating in class-C configuration, with a low conduction angle, a minimum of both gain and output power will be provided. As the bias voltage is varied between these two extremes, the output power of amplifier 220 will be modulated, hence providing the required amplitude modulation of the phase modulated signal 216 in order to produce the output signal 224.

The variation in gain and output power of amplifier 220 in dependence upon variation of the bias voltage output by amplifier 228 will not be linear. However, it will be much more linear than, say, the transfer characteristic of a class-C amplifier and the degree of linearisation required will be realistic. In FIG. 2, the linearisation is provided by means of predistorter 226. Predistorter 226 adjusts the amplitude modulation information 210 to produce corresponding adjustments in the voltage bias signal on amplifier 228, thus imposing distortions upon the signal supplied to amplifier 220 which tend to counteract the distortion which the amplifier 220 itself imposes upon the signals on which it operates.

Figure 3:
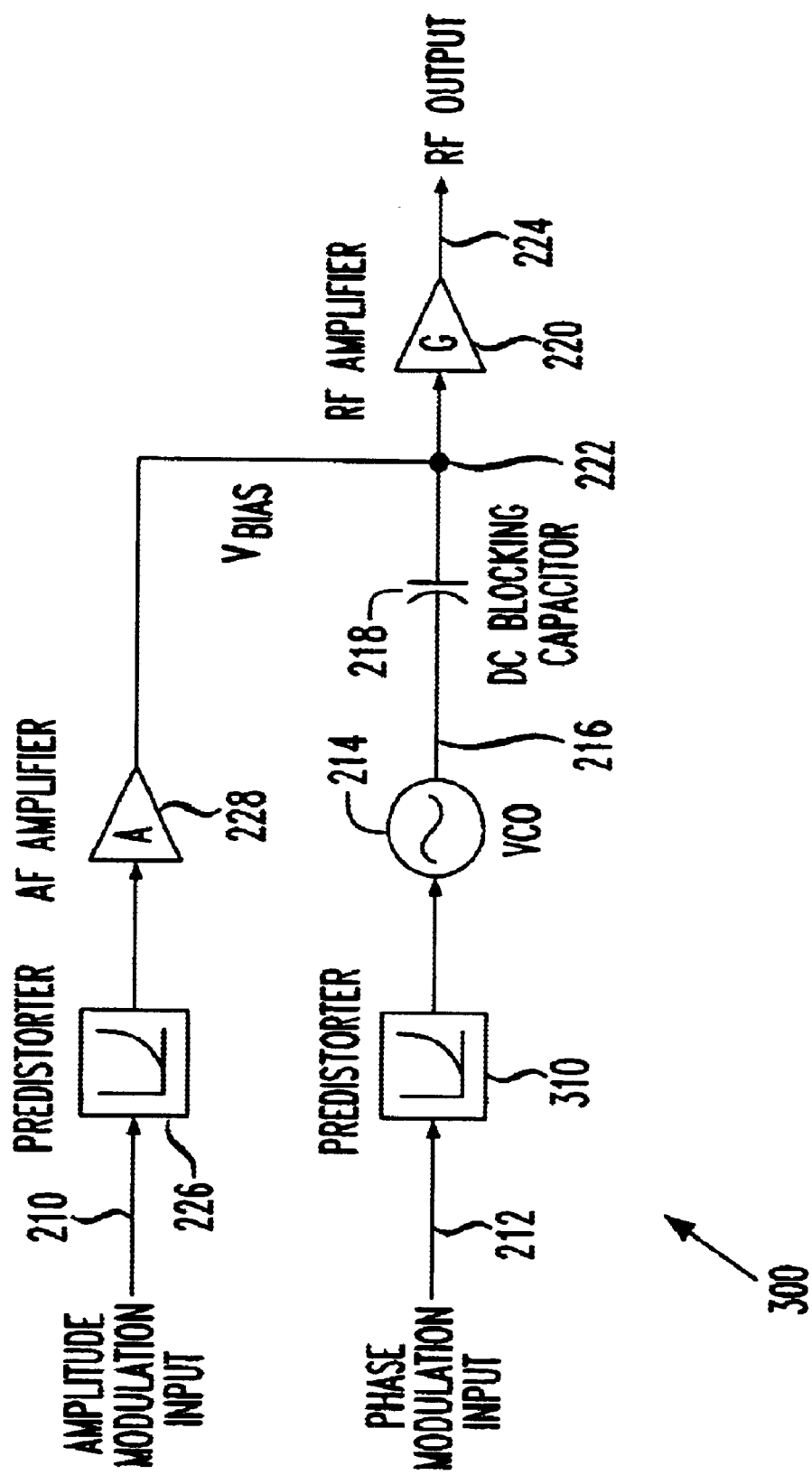

The variation of the operating class of amplifier 220 from class-A to class-C may also result in a degree of AM-PM conversion in the output signal. This will manifest itself as distortion in the output spectrum and may also require linearisation in some circumstances. The amplification scheme 300 of FIG. 3 illustrates the use a predistorter 310 to provide this additional linearisation. Predistorter 310 adapts the phase modulation information so that the VCO produces a phase modulated signal which is distorted in such a manner as to counter AM-PM distortion imposed by amplifier 220.

The amplification scheme 400 of FIG. 4 utilises a baseband quadrature format input signal in terms of an in-phase component 410 and a quadrature phase component 412. The components 410 and 412 are supplied to a DSP 414. A conversion process 416 within DSP 414 converts the I&Q components 410, 412 to polar format comprising amplitude component 418 and phase component 420, conveying amplitude and phase modulation information, respectively.

The amplitude component 418 is then predistorted using predistortion process 422 in DSP 414 to produce a predistorted amplitude component. The DSP 414 also scales the predistorted amplitude component (in a manner analogous to the operation of amplifier 228 in FIGS. 2 and 3) to produce a bias voltage signal. Digital-to-analogue converter (DAC) 424 converts this bias signal into an analogue signal. The bias voltage signal is then combined with the phase modulated signal at 222, as described previously with reference to FIG. 2.

Returning to the operation of DSP 414, the phase component 420 is predistorted by predistortion process 426, and the predistorted phase component is converted into an analogue signal by DAC 428. The analogue predistorted phase component is then used to control the generation of the phase modulated signal 216 by VCO 214, as described previously with reference to FIG. 2.

In scheme 500 of FIG. 5, the input signal is provided as a modulated RF signal 510, instead of in the form of baseband modulation information as in FIGS. 2 to 4. The RF input signal 510 is supplied in parallel by splitter 512 to an envelope detector 514 and a limiter 518.

The output signal of envelope detector 514 conveys the envelope information extracted from the input signal 510. The output of envelope detector 514 is predistorted at 226 and amplified at 228 to produce the bias voltage signal as described previously with reference to FIG. 2. Limiter 518 removes envelope variations from the input signal 510 such that its output contains only phase modulation. The output of limiter 518 is equivalent to the output 216 of VCO 214 in FIG. 2 and is processed subsequently in the same manner via capacitor 218, combiner 222 and amplifier 220.

Figure 6:
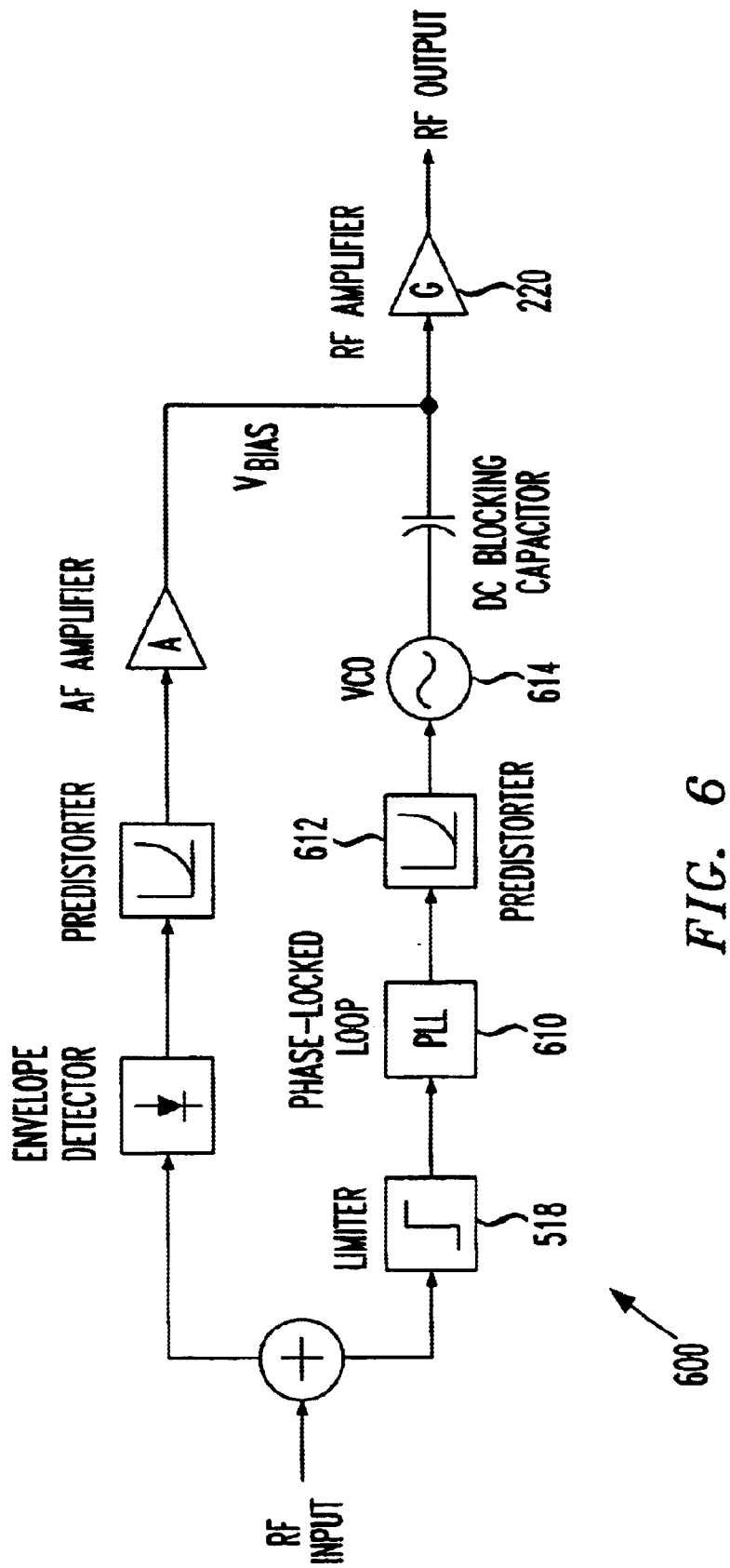

Amplifying scheme 600 of FIG. 6 is similar to that of scheme 500, except that it now also includes predistortion in the phase component path. The phase modulated signal output from limiter 518 is supplied to phase-locked loop (PLL) 610 which demodulates the phase information therefrom. It is possible to use alternative mechanisms, such as a frequency discriminator, in place of the PLL 610 to perform the phase demodulation process.

The phase modulation information is then predistorted by phase predistorter 612 and the predistorted phase information is used by VCO 614 to generate a phase-predistorted, phase-modulated signal. The VCO 614 could also be used to shift the frequency of the input signal. The output of VCO 614 is subsequently combined with the bias voltage signal derived from the amplitude component, as was described in relation to FIG. 5. The provision of predistorter 612 in the phase component path is designed to reduce the AM-PM distortion of the amplifier 220, in a similar manner to predistorter 310 in FIG. 3.

It is possible to use adaptive predistorters in the amplifying schemes previously described, and some control arrangements for implementing adaptive predistorters will now be described.

The amplifying scheme 700 of FIG. 7 illustrates the application of adaptive predistortion to the amplifying scheme 300 of FIG. 3. In scheme 700, a sample of the output of amplifier 220 is removed at directional coupler 710, and attenuated at 712 before being supplied to splitter 714. The (attenuated) output sample from splitter 714 is then used in the control of predistorters 226 and 310.

The envelope of the output sample is detected at 716 and the resulting envelope signal is supplied to controller 718. Controller 718 compares the amplitude modulation information 210, representative of the envelope of the input signal, with the detected envelope of the (attenuated) output signal sample. The controller 718 dynamically reshapes the predistortion characteristic of predistorter 226 in response to an error signal generated from the difference between the inputs to controller 718.

The output sample is also supplied to phase detector 720 (implemented here as a multiplier). Phase detector 720 also receives the phase modulated signal output by the VCO (tapped at splitter 722). The resulting signal output by phase detector 720 is indicative of the phase error introduced by the amplifier 220 to its output. This error signal is fed to controller 724 where it is corrected to compensate for the pure time-delay of the amplifier 220. The controller 724 then adapts the predistortion characteristic of predistorter 310 in such a manner as to minimise the corrected error. In other respects, amplifying scheme 700 is similar to amplifying scheme 300.

An alternative linearisation mechanism, suitable for narrow-band signals, is used in amplifying scheme 800 of FIG. 8. In scheme 800, the feedback process operates in a polar-loop format and predistorters are unnecessary. The detected envelope signal, indicative of the envelope of the (attenuated) output signal sample, produced by envelope detector 716 is supplied to the inverting input of op-amp 810. The amplitude modulation information 210 of the input signal is supplied to the non-inverting input of the op-amp 810. The output of op-amp 810 provides the input to audio frequency amplifier 228 which, in turn, produces the bias voltage signal, as previously. The output signal sample from splitter 714 is also supplied to phase detector 812 (implemented here as a multiplier). Phase detector 812 compares the output of channel synthesiser 814 with the output signal sample to produce a phase error signal. The phase error signal is supplied to the inverting input of op-amp 816. The phase modulation information 212 of the input signal is supplied to the non-inverting input of op-amp 816. The output of op-amp 816 is used to control the generation by the VCO of the phase modulated signal destined for combination with the bias voltage signal. In effect, the VCO, synthesiser 812 and op-amp 816 form a PLL which steers the output of the VCO to the frequency of synthesiser 812. Synthesiser 812 therefore dictates the frequency of the RF output signal from amplifier 220.

Since the feedback arrangement of scheme 800 operates in real-time, it is subject to the usual gain-bandwidth-delay limitations of all feedback systems, and this limits its operation to narrowband use.

Amplifying scheme 900 of FIG. 9 illustrates the application of adaptive predistortion to amplifying scheme 600.

In scheme 900, the output of amplifier 220 is sampled at directional coupler 910 and attenuated at 912. The envelope of the attenuated output signal sample is detected at 914 and controller 916 compares this envelope signal with the RF input signal 510. The controller 916 uses the input signal sample and the detected envelope of the (attenuated) output signal sample to produce an error signal indicative of residual distortion in the output of amplifier 220. The error signal is used to adapt the predistortion characteristic of a RF predistorter 918 operating on the input signal 510. The predistorted input signal produced by predistorter 918 is then supplied to envelope detector 514 and limiter 518 and processed as previously described with reference to FIG. 6.

The predistorters used in the amplifying schemes described above may be implemented in the digital or analogue domain, as appropriate. Where digital predistortion is used, this can be achieved by using a lookup table which is indexed by input signal values to provide a corresponding predistorted output values. Non real time feedback may be used to update the values stored in the lookup table.

What is claimed is:

1. Apparatus for amplifying an input signal provided in polar format comprising an amplitude component and a phase component to produce an output signal, the apparatus comprising a biaser configured to derive a bias signal from the amplitude component, a combiner configured to combine the bias signal with the phase component to produce a biased phase component signal, and an amplifier whose gain depends upon the bias provided to the signal it amplifies, wherein the amplifier is supplied with the biased phase component signal to produce the output signal.

2. The apparatus of claim 1, further comprising a linearizing scheme configured to counteract distortion in the output signal.

3. The apparatus of claim 2, wherein the linearizing scheme comprises a subtractor for subtracting modulation information obtained from the output signal from modulation information that is used to create the phase and amplitude components.

4. The apparatus of claim 3, wherein the subtractor is arranged to subtract amplitude information obtained from the output signal from amplitude modulation information that is used to create the amplitude component.

5. The apparatus of claim 3, wherein the subtractor is arranged to subtract phase information obtained from the output signal from phase modulation information that is used to create the phase component.

6. The apparatus of claim 2, wherein the linearizing scheme comprises a predistortion scheme configured to predistort the input signal.

7. The apparatus of claim 6, wherein the predistortion scheme comprises an amplitude predistorter configured to predistort the amplitude component of the input signal.

8. The apparatus of claim 6, wherein the predistortion scheme comprises a phase predistorter configured to predistort the phase component of the input signal.

9. The apparatus of claim 6, wherein the predistortion scheme operates on at least one of the components of the input signal in the digital domain.

10. The apparatus of claim 6, wherein the predistortion scheme monitors residual distortion in the output signal and adapts the predistortion of the input signal to reduce the residual distortion.

11. The apparatus of claim 1, wherein the input signal is provided as a modulated carrier signal and the apparatus comprises a limiter configured to limit the modulated carrier signal to produce the phase component.

12. The apparatus of claim 1, wherein the input signal is provided as a modulated carrier signal, and the apparatus comprises a detector configured to detect the envelope of the modulated carrier signal to produce the amplitude component.

13. The apparatus of claim 1, wherein the input signal is provided as a quadrature signal and the apparatus comprises a converter configured to convert the input signal from quadrature to polar format.

14. The apparatus of claim 1, wherein the input signal is provided as a channel of amplitude modulation information and a channel of phase modulation information, and the apparatus comprises a converter configured to derive the amplitude and phase components from the amplitude and phase modulation information channels, respectively.

15. The apparatus of claim 1, wherein the biaser is configured to amplify envelope information from the amplitude component to derive the bias signal.

16. A method of amplifying an input signal to produce an output signal, comprising the steps of:

(a) providing the input signal in polar format comprising an amplitude component and a phase component;

(b) deriving a bias signal from the amplitude component, (c) combining the bias signal with the phase component to produce a biased phase component signal; and (d) amplifying the biased phase component signal to produce the output signal using an amplifier whose gain depends upon the bias provided to the signal which it amplifies.

* * * * *